United States Patent
Hu et al.

(10) Patent No.: US 9,330,947 B2
(45) Date of Patent: May 3, 2016

(54) METHODS FOR FORMING PACKAGE-ON-PACKAGE STRUCTURES HAVING BUFFER DAMS

(71) Applicant: Taiwan Semiconductor Manufacturing Company, Ltd., Hsin-Chu (TW)

(72) Inventors: Shou-Cheng Hu, Tai-Chung (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/446,478

(22) Filed: Jul. 30, 2014

(65) Prior Publication Data

US 2014/0335662 A1 Nov. 13, 2014

Related U.S. Application Data

(62) Division of application No. 13/559,153, filed on Jul. 26, 2012, now Pat. No. 8,816,507.

(51) Int. Cl.
*H01L 21/56* (2006.01)
*H01L 23/00* (2006.01)
*H01L 21/683* (2006.01)
*H01L 23/31* (2006.01)

(52) U.S. Cl.
CPC ............ *H01L 21/566* (2013.01); *H01L 21/568* (2013.01); *H01L 21/6835* (2013.01); *H01L 24/19* (2013.01); *H01L 23/3121* (2013.01); *H01L 2221/68372* (2013.01); *H01L 2224/04105* (2013.01); *H01L 2224/32245* (2013.01); *H01L 2224/73267* (2013.01); *H01L 2225/1035* (2013.01)

(58) Field of Classification Search
CPC ..................................................... H01L 21/566
USPC ........................................................... 438/667
See application file for complete search history.

(56) References Cited

U.S. PATENT DOCUMENTS

| | | | |
|---|---|---|---|
| 6,653,720 B2 | 11/2003 | Kameda | |
| 7,691,747 B2* | 4/2010 | Lin et al. | 438/667 |
| 8,017,439 B2* | 9/2011 | Takahashi et al. | 438/109 |

(Continued)

FOREIGN PATENT DOCUMENTS

| | | |
|---|---|---|
| TW | 201125048 | 7/2011 |
| TW | 201212296 | 3/2012 |

(Continued)

*Primary Examiner* — Chandra Chaudhari
(74) *Attorney, Agent, or Firm* — Slater & Matsil, L.L.P.

(57) ABSTRACT

Package-on-Package (PoP) structures and methods of forming the same are disclosed. In some embodiments, a method of forming a PoP structure may include: placing a device die having a plurality of metal posts over a release layer, wherein the release layer is over a first carrier; forming a plurality of through-assembly vias (TAVs) over the release layer; forming a dam member between the device die and the plurality of TAVs; molding the device die, the dam member, and the plurality of TAVs in a molding compound; and grinding the molding compound to expose ends of the plurality of metal posts and ends of the plurality of TAVs, wherein a top surface of the molding compound is substantially level with the exposed ends of the plurality of metal posts and exposed ends of the plurality of TAVs.

20 Claims, 4 Drawing Sheets

(56) References Cited

U.S. PATENT DOCUMENTS

| | | |
|---|---|---|
| 8,343,810 B2 | 1/2013 | Oh et al. |
| 8,597,982 B2 | 12/2013 | Foote et al. |
| 2006/0220259 A1 | 10/2006 | Chen et al. |
| 2009/0154128 A1 | 6/2009 | Tamadate |
| 2011/0136309 A1 | 6/2011 | Grivna et al. |
| 2011/0309404 A1 | 12/2011 | Lee |
| 2012/0013007 A1 | 1/2012 | Hwang et al. |
| 2012/0319300 A1 | 12/2012 | Kim et al. |
| 2014/0110836 A1 | 4/2014 | Tsai et al. |

FOREIGN PATENT DOCUMENTS

| | | |
|---|---|---|
| TW | 201216390 | 4/2012 |
| TW | 201216534 | 4/2012 |

\* cited by examiner

US 9,330,947 B2

METHODS FOR FORMING PACKAGE-ON-PACKAGE STRUCTURES HAVING BUFFER DAMS

PRIORITY CLAIM AND CROSS-REFERENCE

This application is a divisional of U.S. patent application Ser. No. 13/559,153, entitled "Package-on-Package Structures Having Buffer Dams and Methods for Forming the Same," filed on Jul. 26, 2012, which application is hereby incorporated herein by reference.

BACKGROUND

For a more complete understanding of the embodiments, and the advantages thereof, reference is now made to the following descriptions taken in conjunction with the accompanying drawings, in which: In a conventional Package-on-Package (PoP) processes, a top package is bonded to a bottom package. The top package and bottom package may also have device dies packaged therein. By adopting the PoP process, the integration level of the packages may be increased.

In an existing PoP process, the bottom package is formed first, by placing a device die over a release layer, wherein the release layer is over a carrier. A plurality of through-assembly vias (TAVs) is formed over the release layer, and the release layer is formed over a carrier. The device die and the plurality of TAVs are then molded in a molding compound and the molding compound is then cured. Due to shrinkage of the molding compound following the step of curing, stress from the cured molding compound and the TAVs may cause the device die to delaminate from the release layer.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

A Package-on-Package (PoP) structure and the methods of forming the same are provided in accordance with various exemplary embodiments. The intermediate stages of forming the PoP structure are illustrated. The variations of the embodiments are discussed. Throughout the various views and illustrative embodiments, like reference numbers are used to designate like elements.

Figure 1:
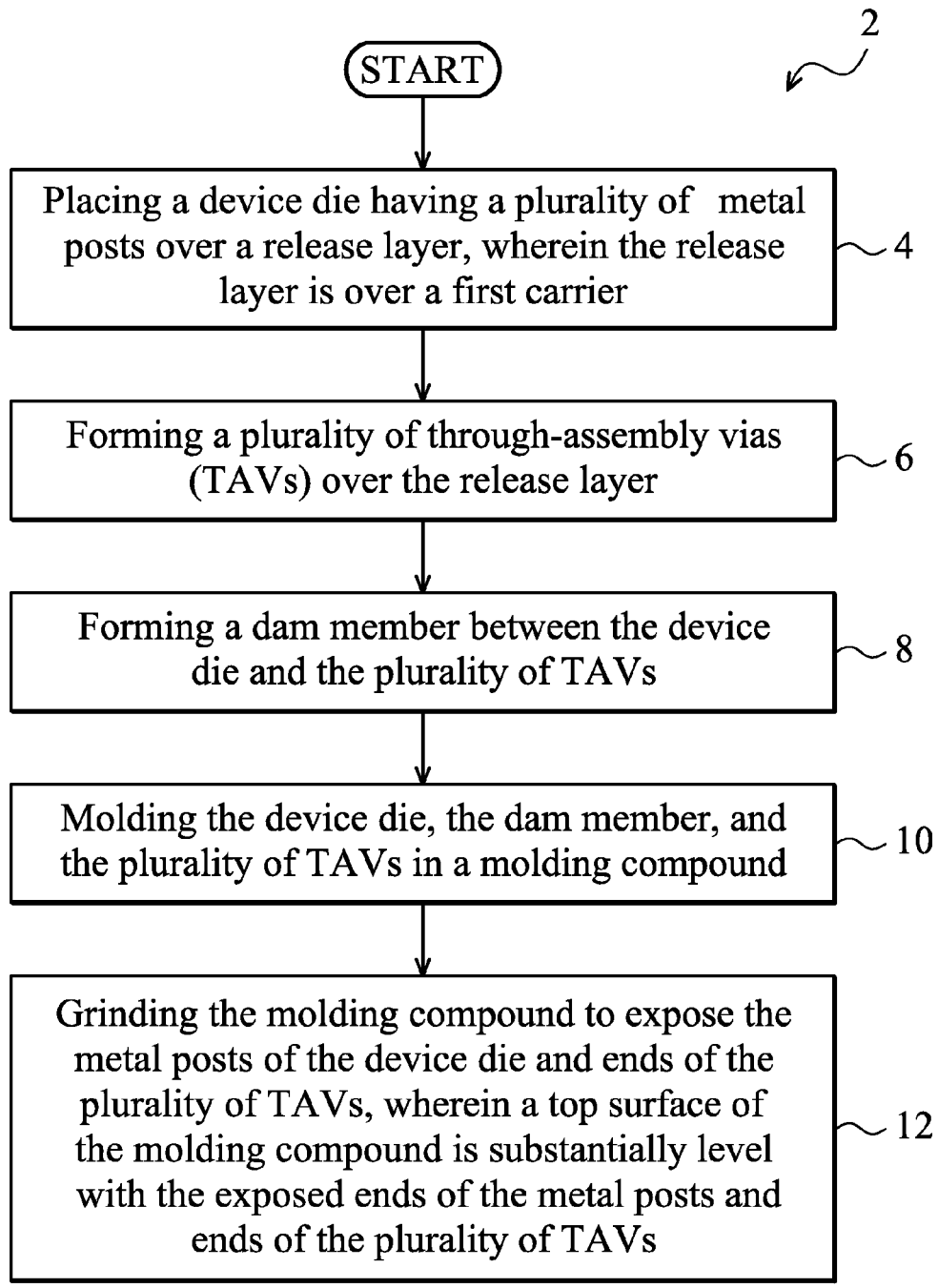
FIG. 1 is a flowchart of a method of fabricating a portion of a Package-on-Package (PoP) structure, in accordance with an exemplary embodiment.

FIG. 1 is a flowchart of a method 2 for fabricating a portion of a Package-on-Package (PoP) structure, in accordance with an exemplary embodiment. Referring to FIG. 1, the method includes block 4, in which a device die having a plurality of metal posts is placed over a release layer. The release layer is formed over a carrier. The method 2 includes block 6, in which a plurality of through-assembly vias (TAVs) are formed over the release layer. The method 2 includes block 8, in which a dam member is formed between the device die and the plurality of TAVs. The method 2 includes block 10, in which the device die, the dam member, and the plurality of TAVs are molded in a molding compound. The method 2 includes block 12, in which the molding compound is ground to expose the plurality of metal posts of the device die and the ends of the plurality of TAVs, such that a top surface of the molding compound is substantially level with the exposed ends of the metal posts and the ends of the plurality of TAVs.

It is understood that additional processes may be performed before, during, or after the blocks 4-12 shown in FIG. 1 to complete the fabrication of a PoP structure, but these additional processes are not discussed herein in detail for the sake of simplicity.

FIGS. 2 through 11 are cross-sectional views and a top view of intermediate stages in the manufacturing of a Package-on-Package (PoP) structure in accordance with some exemplary embodiments. It is understood that FIGS. 2 through 11 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
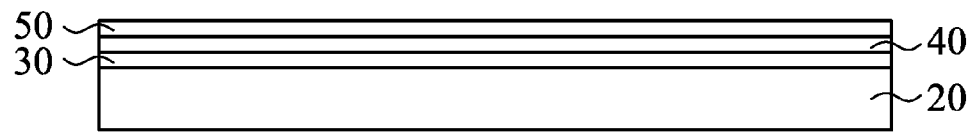
FIGS. 2 through 11 are cross-sectional views and a top view of intermediate stages in the manufacturing of a PoP structure, in accordance with some exemplary embodiments.

FIG. 2 illustrates carrier 20, release layer 30 on carrier 20, passivation layer 40 on release layer 30, and seed layer 50 on passivation layer 40. Carrier 20 may be a glass carrier, a ceramic carrier, or the like. Release layer 30 may be formed of an adhesive such as an Ultra-Violet (UV) glue. Passivation layer 40 is a sacrificial layer in that in subsequent processes, the passivation layer 40 will be ground to expose ends of a subsequently formed plurality of Through-Assembly Vias (TAVs) for electrical connection to another package in the formation of a PoP structure. Passivation layer 40 may be formed of dielectric materials such as polyimide, polybenzoxazole (PBO), benzocyclobutene (BCB), silicones, acrylates, or epoxy and have a thickness in the range from about 3 µm to about 10 µm. The formation methods include plasma enhanced chemical vapor deposition (PECVD) or other commonly used CVD methods. In some embodiments, the passivation layer 40 is optional. Next, seed layer 50 is deposited on passivation layer 40 for TAV plating and can be used to increase copper plating rate and quality. Seed layer 50 may be formed by electrochemical plating, electroless plating, sputtering, chemical vapor deposition (CVD), or the like. Seed layer 50 may include aluminum, titanium, copper, alloys, or the like. If the seed layer 50 is a copper seed layer, the copper seed layer may be formed of copper or one of copper alloys that include silver, chromium, nickel, tin, gold, and combinations thereof. The thickness of the copper seed layer 50 is in a range between about 1000 Angstroms to about 5000 Angstroms.

Figure 3:

Referring to FIG. 3, a dam member 60 is formed on seed layer 50 between a subsequently formed device die and a plurality of TAVs. The dam member 60 comprises a soft material that can absorb some of the molding compound shrinkage stress due to the curing of the molding compound, thus preventing a device die from delaminating from the release layer 30. The dam member 60 is a material having a coefficient of thermal expansion (CTE) in the range from about 10 ppm/K to about 250 ppm/K, a Young's Modulus in the range from about 0.05 GPa to 4.5 GPa, and a glass transition temperature (Tg) in the range from about 150 Celsius to about 450 Celsius. In some embodiments, dam member 60 has a thickness less than 100 μm. In some other embodiments, dam member 60 has a thickness less than about 700 μm.

Being a soft material, dam member 60 may include polyimide, polybenzoxazole (PBO), benzocyclobutene (BCB), silicones, acrylates, polymers, epoxy, and the like, although other relatively soft, often organic, dielectric materials can also be used. Being soft, the dam member 60 has the function of reducing inherent stresses caused by a cured molding compound and the TAVs.

Dam member 60 may be formed by photolithography in which a material for dam member 60 is deposited on seed layer 50, patterned, and then etched to form dam member 60. Although the sidewalls of dam member 60 are drawn to be slanted in FIG. 3, the sidewalls of dam member 60 can be substantially vertical in some embodiments.

In some embodiments, dam member 60 may be formed by a printing method. Using the printing method, a stencil with a desired coating area cut out may be overlaid on the seed layer 50, then material for the dam member 60 may be dispensed on a flat part of the stencil. In some embodiments, one or more blades or wipers may brush across the stencil back and forth to apply the material in the cut out portion in a uniform manner. The thickness of the stencil corresponds to the thickness of the desired material coating. The stencil may be a metal sheet having a cut out portion in the shape of the dam member 60.

In some other embodiments, the dam member 60 may be formed on the PoP structure by a taping method. In one embodiment, a tape having pre-formed dam members may be applied to the seed layer 50. The tape is then removed leaving behind the dam members on seed layer 50. Although FIG. 3 shows the formation of dam member 60 before the formation of a subsequently formed plurality of TAVs, in some embodiments, dam member 60 can be formed after the formation of TAVs.

Figure 4:
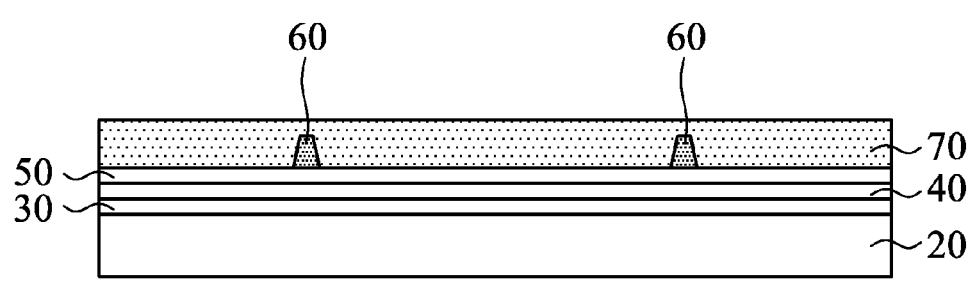
Figure 5:
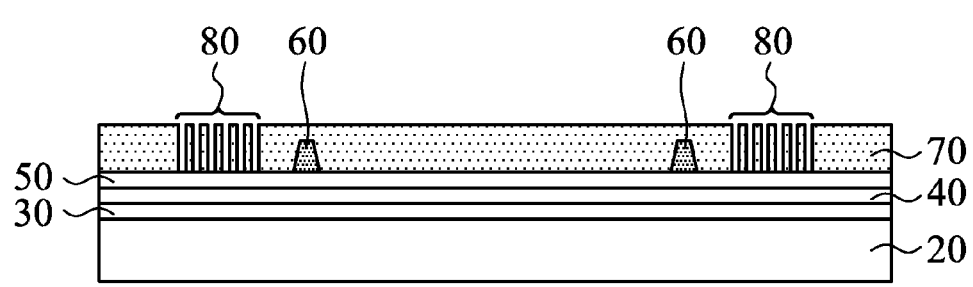
Figure 6:
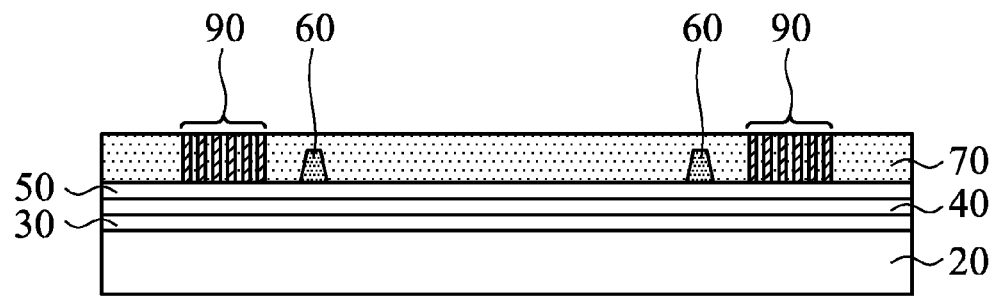
Figure 7:
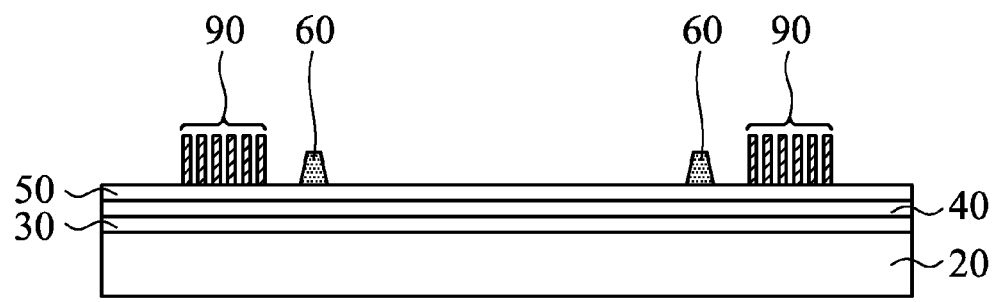

FIGS. 4 through 7 are cross-sectional views of intermediate stages in the formation of a plurality of Through-Assembly Vias (TAVs) 90, according to one embodiment. In FIG. 4, a dry film layer 70 is deposited on seed layer 50 and over dam members 60. Dry film layer 70 may be formed of a polymer material and have a thickness of around 120 μm, in one embodiment. The formation methods may include steps such as laminating, photolithograph processes, and developing. The dry film layer may be deposited using, e.g., CVD methods. In a photolithographical process the dry film layer 70 is patterned, and etched to form a plurality of openings 80 in the dry film layer 70, as shown in FIG. 5. In FIG. 6, a plurality of TAVs 90 are formed in the plurality of openings 80 using a plating process, such as for example electrochemical plating, electroless plating, sputtering, chemical vapor deposition (CVD), and the like. The plurality of TAVs 90 are formed of a conductive material, which may include copper, aluminum, tungsten, and/or the like. Following the TAV plating process, the dry film layer 70 is then removed as shown in FIG. 7 using a stripping process, for example. In some embodiments, the TAVs 90 may be pre-formed before being placed on seed layer 50. Although, FIGS. 4 through 7 show the TAVs 90 formed after dam member 60, in some embodiments, the TAVs 90 can be formed before the dam member 60 is formed.

Figure 8:
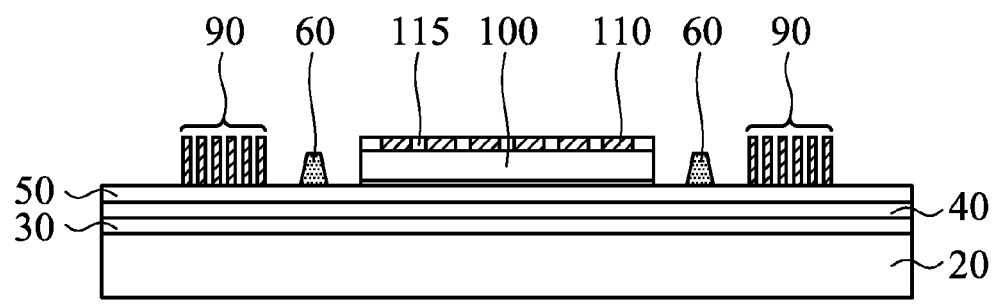

FIG. 8 shows a device die 100 on seed layer 50, the device die 100 being surrounded by dam member 60. The bottom surfaces of device die 100 and the plurality of TAVs 90 are in contact with the top surface of seed layer 50, and are level with each other. The position of device die 100 and the plurality of TAVs 90 are accurately aligned to desirable locations, so that the subsequent formed redistribution lines may electrically couple to metal posts 110 and ends of the plurality of TAVs 90. Although FIG. 8 shows a single device die 100 on seed layer 50, in some embodiments, there may be a plurality of device dies 100 on seed layer 50. Also, device die 100 may be any type of device die. For example, device die 100 may include a Central Processing Unit (CPU) die or another type of logic die having logic circuits. In some embodiments, device die 100 may include interposer(s), package substrate(s), and/or the like. In alternative embodiments, device die 100 may include a plurality of memory dies stacked together. Although not shown in the figures, device die 100 may include a semiconductor substrate and active devices (such as transistors). The bottom surface of the semiconductor substrate is thus in contact with seed layer 50.

FIG. 8 also shows a plurality of metal posts 110 formed on a top surface of device die 100. In some embodiments, a dielectric layer 115 is formed at the top surface of device die 100 with metal posts 110 embedded therein. The plurality of metal posts 110 are electrically coupled to the device die 100. The top surfaces of metal posts 110 and the plurality of TAVs 90 are substantially level with each other.

Figure 9:
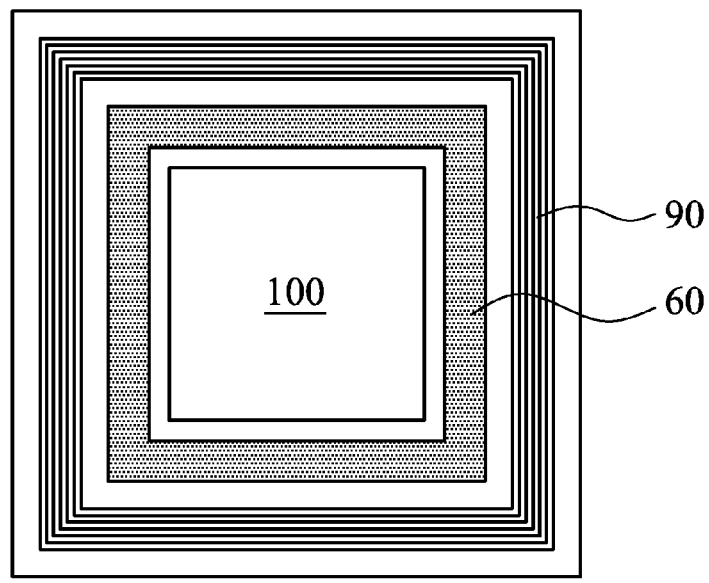

FIG. 9 illustrates a top view of the structure in FIG. 8. Although FIG. 9 shows the device die 100 being completely surrounded by the dam member 60, in some other embodiments, the dam member 60 partially surrounds the device die 100. Also, although a continuous plurality of TAVs 90 are illustrated, in some embodiments a plurality of TAVs 90 may be disposed on any two opposite sides of device die 100, and in some other embodiments, the plurality of TAVs 90 are disposed on all opposite sides of device die 100. The plurality of TAVs 90 may have an identical structure. Alternatively, TAVs 90 may have different structures with different counts of vias, different layouts of vias, different sizes, and/or different materials.

Figure 10:
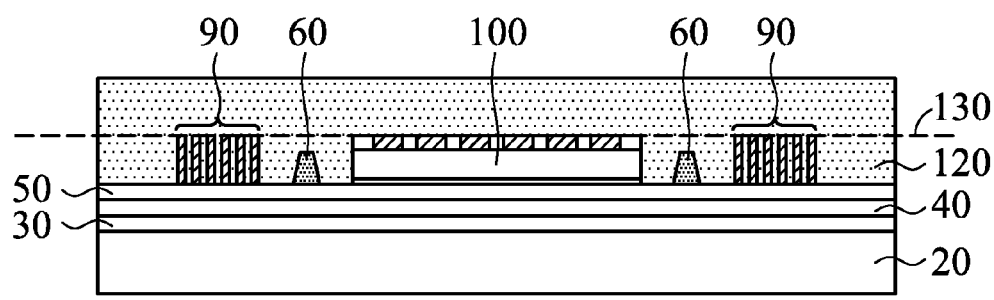
Figure 11:
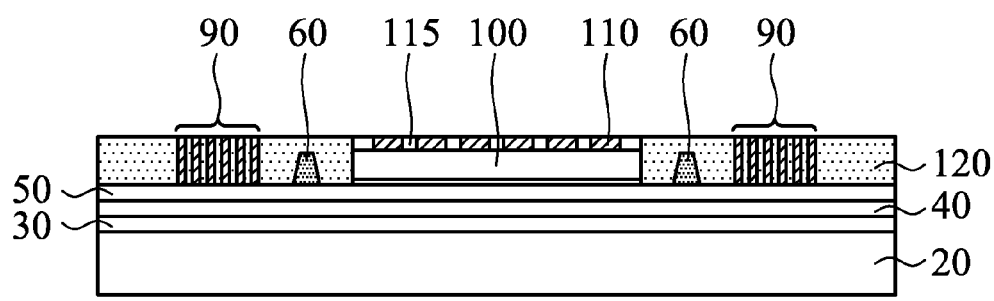

Next, referring to FIG. 10, polymer layer 120 is molded on device die 100, dam member 60, and the plurality of TAVs 90. Polymer layer 120 fills the gaps between device die 100, dam member 60, and the plurality of TAVs 90, and may be in contact with seed layer 50. Furthermore, polymer layer 120 is filled into the gaps between metal posts 110. Polymer layer 120 may include a molding compound, a molding underfill, or a kind of epoxy. The top surface of polymer layer 120 may be level with or higher than the top surfaces of metal posts 110 and TAVs 90. A grinding step may be performed to grind polymer layer 120, until metal posts 110 and TAVs 90 are exposed. Line 130 marks an exemplary position of the top surface of polymer layer 120 after the grinding. FIG. 11 shows the structure of FIG. 10 following the grinding step. In one embodiment, a top surface of the polymer layer 120 is substantially level with the exposed ends of the metal posts 110 and the ends of the plurality of TAVs.

In subsequent processes, a plurality of Redistribution Lines (RDLs) (not shown) are formed over the polymer layer 120 and connected to the metal posts 110 and ends of the plurality of TAVs 90. The device die 100, the plurality of TAVs 90, the dam member 60, and the plurality of RDLs form a package. A carrier switch is then performed in which the package is mounted on a second carrier, wherein the carrier 20 and second carrier are on opposite sides of the package. The carrier 20 is then demounted from the package and the release layer 30 is thereafter removed.

The PoP structures shown in FIGS. 2-11 are only for illustrative purpose and are not limiting. It is understood by those skilled in the art that the present disclosure only discusses intermediate stages in the manufacture of a PoP structure, and that for the manufacture of a completed PoP structure, further processes are required. Additional embodiments and steps can be conceived.

Advantages of one or more embodiments of the present disclosure may include one or more of the following.

In one or more embodiments, the dam member 60 serving as a buffer wall between the device die 100 and the plurality of TAVs 90 reduces the molding compound shrinkage stress due to the curing of the molding compound and helps prevent the device die 100 from delaminating from the release layer 30.

In one or more embodiments, the dam member 60 comprising a soft material absorbs some of the molding compound shrinkage stress, thus preventing the device die from delaminating from the release layer 30.

In one or more embodiments, the reliability of the PoP structure is enhanced.

In one or more embodiments, the process margin for bumping in bonding a top package to a bottom package is improved.

The present disclosure has described various exemplary embodiments. According to one embodiment, a device comprises a device die and a plurality of metal posts formed at a surface of the device die and electrically coupled to the device die. The device further includes a plurality of through-assembly vias (TAVs), a dam member disposed between the device die and the plurality of TAVs, and a polymer layer encompassing the device die, the plurality of metal posts, the plurality of TAVs, and the dam member.

According to another embodiment, a device comprises a device die and a dielectric layer formed at a surface of the device die. The device further includes a plurality of metal posts embedded in the dielectric layer, the plurality of metal posts electrically coupled to the device die. The device also includes a plurality of TAVs surrounding the device die, a dam member surrounding the device die and the plurality of TAVs surrounding the dam member, and a molding compound with the device die, the dielectric layer, the plurality of metal posts, the plurality of TAVs, and the dam member molded therein, the molding compound having a top surface substantially level with ends of the metal posts and ends of the plurality of TAVs.

According to yet another embodiment, a method for forming a device comprises placing a device die having a plurality of metal posts over a release layer, wherein the release layer is over a first carrier. A plurality of TAVs is formed over the release layer. A dam member is formed between the device die and the plurality of TAVs. The device die, the dam member, and the plurality of TAVs are molded in a molding compound. The molding compound is then ground to expose metal posts and ends of the plurality of TAVs, wherein a top surface of the molding compound is substantially level with the exposed ends of the metal posts and ends of the plurality of TAVs.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method comprising:
   placing a device die having a plurality of metal posts over a release layer, wherein the release layer is over a first carrier;
   forming a plurality of through-assembly vias (TAVs) over the release layer;
   forming a dam member between the device die and the plurality of TAVs;
   molding the device die, the dam member, and the plurality of TAVs in a molding compound; and
   grinding the molding compound to expose ends of the plurality of metal posts and ends of the plurality of TAVs, wherein a top surface of the molding compound is substantially level with the exposed ends of the plurality of metal posts and the exposed ends of the plurality of TAVs.

2. The method of claim 1, wherein the dam member is formed by photolithography, taping, or stencil printing.

3. The method of claim 1, further comprising forming a seed layer and a passivation layer between the seed layer and the release layer, wherein the plurality of TAVs is formed directly on the seed layer.

4. The method of claim 1, further comprising:
   forming a plurality of redistribution lines (RDLs) over the molding compound and connected to the plurality of metal posts and ends of the plurality of TAVs, wherein the device die, the plurality of TAVs, the dam member, and the plurality of RDLs form a package;
   mounting the package on a second carrier, wherein the first and second carriers are on opposite sides of the package; and
   demounting the first carrier from the package and removing the release layer.

5. A method, comprising:
   providing a first carrier having a release layer disposed thereon, the first carrier having a die attach region, a first outer region surrounding the die attach region, and a second outer region surrounding the first outer region;
   placing a device die over the release layer in the die attach region of the first carrier;
   forming a dam member over the release layer in the first outer region of the first carrier;
   forming a plurality of through-assembly vias (TAVs) over the release layer in the second outer region of the first carrier; and
   encapsulating the device die, the dam member, and the plurality of TAVs in a first polymer material.

6. The method of claim 5, wherein the forming the plurality of TAVs over the release layer comprises:
   depositing a second polymer material over the release layer;

forming a plurality of openings in the second polymer material in the second outer region of the first carrier;

filling the plurality of openings with a conductive material to form the plurality of TAVs; and removing the second polymer material while leaving the plurality of TAVs over the release layer.

7. The method of claim 6, wherein the forming the plurality of openings comprises an etching process.

8. The method of claim 6, wherein the filling the plurality of openings with the conductive material comprises a plating process.

9. The method of claim 6, wherein the removing the second polymer material comprises a stripping process.

10. The method of claim 5, wherein the forming the plurality of TAVs over the release layer comprises:

picking the plurality of TAVs from a third carrier; and after the picking, placing the plurality of TAVs over the release layer in the second outer region of the first carrier.

11. The method of claim 5, wherein the forming the dam member over the release layer comprises at least one of a photolithographic process, a taping process, or a printing process.

12. The method of claim 5, wherein the device die comprises a plurality of metal posts formed at a first surface, and wherein the first surface of the device die faces away from the release layer.

13. A method, comprising:

providing a first carrier having a seed layer and a release layer disposed thereon, the release layer disposed between the seed layer and the first carrier, the first carrier having a dam region, a die region laterally adjacent to and spaced apart from a first side of the dam region, and a via region laterally adjacent to and spaced apart from a second side of the dam region opposite the first side;

placing a device die having a plurality of metal posts over the seed layer in the die region of the first carrier, the plurality of metal posts facing away from the seed layer;

forming a dam member over the seed layer in the dam region of the first carrier;

forming a plurality of through-assembly vias (TAVs) over the seed layer in the via region of the first carrier; and encompassing the device die, the dam member, and the plurality of TAVs in a molding compound.

14. The method of claim 13, wherein the encompassing the device die, the dam member, and the plurality of TAVs comprises:

encapsulating and covering the device die, the dam member, and the plurality of TAVs in the molding compound; and planarizing the molding compound to expose at least one of the plurality of metal posts of the device die or ends of the plurality of TAVs distal the seed layer.

15. The method of claim 13, further comprising:

forming a plurality of redistribution lines (RDLs) over the molding compound, the plurality of RDLs being electrically connected to the plurality of metal posts of the device die and the plurality of TAVs, wherein the device die, the plurality of TAVs, the dam member, and the plurality of RDLs form a package;

mounting the package on a second carrier, wherein the first and second carriers are on opposite sides of the package; and demounting the first carrier from the package.

16. The method of claim 13, wherein the providing the first carrier having the seed layer and the release layer disposed thereon comprises providing the first carrier having the seed layer, the release layer, and a passivation layer disposed thereon, wherein the passivation layer is disposed between the seed layer and the release layer.

17. The method of claim 13, wherein the forming the dam member over the seed layer in the dam region of the first carrier comprises completely surrounding the die region of the first carrier with the dam member.

18. The method of claim 13, wherein the forming the dam member over the seed layer in the dam region of the first carrier comprises partially surrounding the die region of the first carrier with the dam member.

19. The method of claim 13, wherein the forming the dam member over the seed layer comprises forming the dam member comprising a material having a coefficient of thermal expansion (CTE) in the range from about 10 ppm/K to about 250 ppm/K, a Young's Modulus in the range from about 0.05 GPa to 4.5 GPa, and a glass transition temperature (Tg) in the range from about 150 Celsius to about 450 Celsius.

20. The method of claim 13, wherein the forming the dam member over the seed layer comprises forming the dam member comprising at least one of a polyimide, polybenzoxazole (PBO), benzocyclobutene (BCB), silicones, acrylates, polymers, epoxy, or combinations thereof.

* * * * *